United States Patent [19]

Zimmerman

[11] Patent Number: 5,463,269
[45] Date of Patent: Oct. 31, 1995

[54] PROCESS AND STRUCTURE OF AN INTEGRATED VACUUM MICROELECTRONIC DEVICE

[75] Inventor: Steven M. Zimmerman, Pleasant Valley, N.Y.

[73] Assignee: International Business Machines Corporation, Armonk, N.Y.

[21] Appl. No.: 847,444

[22] Filed: Mar. 6, 1992

Related U.S. Application Data

[63] Continuation of Ser. No. 555,214, Jul. 18, 1990, abandoned.

[51] Int. Cl.$^6$ .................................................. H01J 1/00
[52] U.S. Cl. .................................................. 313/309
[58] Field of Search ................................. 313/309, 336, 313/351

[56] References Cited

U.S. PATENT DOCUMENTS

| | | | |
|---|---|---|---|
| 3,453,478 | 7/1969 | Shoulders et al. | 313/309 |
| 3,497,929 | 3/1970 | Shoulders et al. | 29/25.17 |
| 3,665,241 | 5/1972 | Spindt et al. | 313/351 |
| 3,753,022 | 8/1973 | Fraser, Jr. | 313/336 X |
| 3,755,704 | 8/1973 | Spindt et al. | 313/309 |
| 3,855,499 | 12/1974 | Yamada et al. | 315/169 R |
| 3,921,022 | 11/1975 | Levine | 313/309 |
| 3,970,887 | 7/1976 | Smith et al. | 313/309 |
| 3,998,678 | 12/1976 | Fukase et al. | 156/3 |
| 4,008,412 | 2/1977 | Yito et al. | 313/309 |
| 4,307,507 | 12/1981 | Gray et al. | 29/580 |
| 4,513,308 | 4/1985 | Greene et al. | 357/55 |
| 4,721,885 | 1/1988 | Brodie | 313/576 |
| 4,766,340 | 8/1988 | van der Mast et al. | 313/366 |
| 4,857,799 | 8/1989 | Spindt et al. | 313/495 |
| 4,889,588 | 12/1989 | Fior | 156/643 |
| 5,012,153 | 4/1991 | Atkinson et al. | 313/309 X |

FOREIGN PATENT DOCUMENTS

| | | |
|---|---|---|
| 0150885 | 2/1984 | European Pat. Off. . |
| 2536363 | 8/1974 | Germany . |

OTHER PUBLICATIONS

C. A. Spindt, "A Thin–Film Field–Emission Cathode," J. Appl. Phys., vol. 39, No. 7, pp. 3504–3505 (1968).
G. J. Campisi, et al., "Microfabrication of Field Emission Devices for Vacuum Integrated Circuits Using Orientation Dependent Etching," Material Res. Soc. Symp. Proc. vol. 76, pp. 67–72 (1987).
I. Brodie, "Physical Considerations in Vacuum Microelectronics Devices," IEEE Transactions on Electron Devices, vol. 36, No. 11, pp. 2641–2644 (Nov., 1989).
N. A. Cade, et al., "Wet Etching of Cusp Structures for Field–Emission Devices," IEEE Transactions on Electron Devices, vol. 36, No. 11, pp. 2709–2714 (Nov., 1989).
R. B. Macus, et al., "Formation of Atomically Sharp Silicon Needles," IEDM, pp. 884–886 (1989).
W. J. Orvis, et al., "A Progress Report on the Livermore Miniature Vacuum Tube Project," IEEE, IEDM, pp. 529–531 (1989). B. Goodman, "Return of the Vacuum Tube," Discover Magazine, pp. 55–58 (Mar., 1990).
W. J. Orvis, et al., "Modeling and Fabricating Micro–Gravity Integrated Vacuum Tubes," IEEE Transactions on Electron Devices, vol. 36, No. 11 pp. 2651–2658 (Nov., 1989).
H. H. Busta, et al., "Field Emission from Tungsten–Clad Silicon Pyramids," IEEE Transactions on Electron Devices, vol. 36, No. 11, pp. 2679–2685 (Nov., 1989).
R. A. Lee, et al., "Semiconductor Fabrication Technology Applied to Micrometer Valves," IEEE Transactions on Electron Devices, vol. 36, No. 11, pp. 2703–2708 (Nov., 1989).

*Primary Examiner*—Sandra L. O'Shea
*Attorney, Agent, or Firm*—Aziz M. Ahsan

[57] ABSTRACT

The present invention relates generally to a new integrated Vacuum Microelectronic Device (VMD) and a method for making the same. Vacuum Microelectronic Devices require several unique three dimensional structures: a sharp field emission tip, accurate alignment of the tip inside a control grid structure in a vacuum environment, and an anode to collect electrons emitted by the tip. Also disclosed is a new structure and a process for forming diodes, triodes, tetrodes, pentodes and other similar structures. The final structure made can also be connected to other similar VMD devices or to other electronic devices.

29 Claims, 6 Drawing Sheets

PROCESS AND STRUCTURE OF AN INTEGRATED VACUUM MICROELECTRONIC DEVICE

This patent application is continuation of U.S. patent application Ser. No. 07/555,214, filed on Jul. 18, 1990 now abandoned.

FIELD OF THE INVENTION

The present invention relates generally to a new integrated Vacuum Microelectronic Device (VMD) and a method for making the same. Vacuum Microelectronic Devices require several unique three dimensional structures: a sharp field emission tip, accurate alignment of the tip inside a control grid structure in preferably a vacuum environment, and an anode to collect electrons emitted by the tip.

CROSS-REFERENCE

This patent application relates to U.S. patent application Ser. No. 555,213, filed concurrently on Jul. 18, 1990, the disclosure of which is incorporated herein by reference.

BACKGROUND OF THE INVENTION

The designers of electronic systems have for many years thought of ways to design and improve semiconductor devices. The vacuum tube, once the mainstay of electronics, had limitations such as the mechanically fabricated structures inside the glass envelope preventing miniaturization and integration, and the thermionic cathode keeping the power drain high. There have recently been significant developments in this area that offer the opportunity of escaping the previous restraints. Semiconductor fabrication techniques can now be used to develop structures in microminiature form and integrate many of them together. Combining these microminiature structures with a field emission electron source one can now produce microminiature vacuum tube structures which do not require heated cathodes. These structures being on the order of micrometers in size, permit the integration of many devices on a single substrate, just as many semiconductor devices are produced on a single chip.

The Vacuum Microelectronic Devices presently in use require several unique three-dimensional structures, which include, a vacuum space, a sharp, preferably less than 100 nm radius field emission tip, and the accurate alignment of tip inside an extraction/control electrode structure. Vacuum Microelectronic Devices include a field-emission cathode and add additional structures, such as, an extension of the vacuum space, an anode opposite the cathode tip, and there may or may not be additional accurately aligned control electrodes placed between the tip and the anode.

The field emission display elements that utilize these Vacuum Microelectronic Devices use the basic field emission structure and add additional structures, such as, an extension of the vacuum space, a phosphor surface opposite the cathode tip, and additional electrodes to collect and/or control the electron current. Groups of individual Vacuum Microelectronic Devices and/or display elements can be electrically interconnected during fabrication to form integrated circuits and/or displays.

Vacuum Microelectronic Devices have several unique features. They are expected to have sub pico second switching speeds and are thought by some to be the fastest electronic devices possible. They will operate at temperatures ranging from near absolute zero to hundreds of degrees Celsius limited principally by their materials of construction. These structures can be made of almost any conductor and insulator material. They are intrinsically radiation hard. They are also very efficient because control is by charge and not by current flow, and the use of high field emitters eliminates the thermionic emission heaters of traditional vacuum devices.

In U.S. Pat. No. 4,721,885, and also in an article published by Ivor Brodie, "Physical Considerations in Vacuum Microelectronics Devices", IEEE Transactions on Electron Devices, Vol. 36, No. 11, pages 2641–2644 (November 1989), a field-emission microtriode is described. The triode consists of a metal cone attached to a metal or high-conductivity semiconductor base electrode. The height of the cone is given as "h" the radius of curvature at the cathode tip is "r". A metal anode is held at a distance "d" from the tip of the cone by a second insulating layer. The cone tip is at the center of a circular hole having a radius "a" in a gate (or first anode) electrode of thickness "t". When the appropriate positive potential difference is applied between the base electrode and the gate electrode, an electric field is generated at the cathode tip that allows electrons to tunnel through the tip into the vacuum space and move towards the anode. The field at the tip and, hence, the quantity of electrons emitted can be controlled by varying the gate potential.

While these Vacuum Microelectronic Devices can be made in almost any size and may have applications as discrete devices, their best performance and major application is expected to come from extreme miniaturization, large arrays, and complex very large scale integration of circuits.

Non-thermionic field emitters, field emission devices, and field emission displays are all known in the art. Since the fabrication of the field emission cathode structure is a critical element common to the devices mentioned, its art will be addressed first. The material (insulators and conductors/field emitters) are all deposited and processed by relatively common deposition and lithographic processing techniques with the single exception of a special sharp edge (blade) or point (tip) structure which is common to all field-emission cathodes. The art can be broadly classified into five categories, and these categories are primarily categorized by the methods used to form this sharp blade or tip.

The first category is one of the earliest categories in which the cathode tip structure is formed by the direct deposition of the material. An example of this type is exemplified in a paper by C. A. Spindt, "A Thin-Film Field-Emission Cathode" J. Appl. Phys., Vol. 39, No. 7, pages 3504–3505 (1968), in which sharp molybdenum cone-shaped emitters are formed inside holes in a molybdenum anode layer and on a molybdenum cathode layer. The two layers are separated by an insulating layer which has been etched away in the areas of the holes in the anode layer down to the cathode layer. The cones are formed by simultaneous normal and steep angle depositions of the molybdenum and alumina, respectively, onto the rotating substrate containing the anode and cathode layers. The newly deposited alumina is selectively removed. Similar work has also been disclosed in U.S. Pat. No. 3,755,704.

A second category is the use of orientation-dependent etching of single crystal materials such as silicon. The principle of the orientation-dependent etching is to preferentially attack a particular crystallographic face of a material. By using single crystal materials patterned with a masking material, the anisotropically etched areas will be bounded by-the slow etching faces which intersect at well defined edges and points of the material's basic crystallographic shape. A suitable combination of etch, material, and orientation can result in very sharply defined points that can be used as field emitters. U.S. Pat. No. 3,665,241 issued to Spindt, et al., is an example of this method in which an etch mask of one or more islands is placed over a single-crystal material which is then etched using an etchant which attacks some of the crystallographic planes of the material faster than the others creating etch profiles bounded by the slow etching planes (an orientation-dependent etch). As the slow etching planes converge under the center of the mask, multifaceted geometric forms with sharp edges and points are formed whose shape is determined by the etchant, orientation of the crystal, and shape of the mask. Orientation-dependent anisotropic etching while an established method to create the tips can also have an adverse effect by making these sharp tips blunt (or reducing the radius of the cathode tip), thus reducing their effectiveness as field emitters, as discussed by Cade, N. A. et al., "Wet Etching of Cusp Structures for Field-Emission Devices," IEEE Transactions on Electron Devices, Vol. 36, No. 11, pages 2709–2714 (November 1989).

A third category uses isotropic etches to form the structure. Isotropic etches etch uniformly in all directions. When masked, the mask edge becomes the center point of an arc which outlines the classic isotropic etch profile under the masking material. The radius of the arc is equal to the etch depth. Etching around an isolated masked island allows the etch profile to converge on the center of the mask leaving a sharp tip of the unetched material which can be used as a field emitter. An example of this is exemplified in U.S. Pat. No. 3,998,678, issued to Shigeo Fukase, et al. An emitter material is masked using islands of a lithographically formed and etch resistant material. The emitter material is etched with an isotropic etchant which forms an isotropic etch profile (circular vertical profile with a radius extending under the resist from the edge). When the etch profile converges under the center of the mask from all sides, a sharp point or tip results.

A fourth category uses oxidation processes to form the Vacuum Microelectronic Device. Oxidation processes form a tip by oxidizing the emitter material. Oxidation profiles under oxidation masks are virtually identical to isotropic etch profiles under masks and form the same tip structure as the profiles converge under a circular mask. When the oxidized material is removed the unoxidized tip can function as a field emitter. U.S. Pat. No. 3,970,887 issued to Smith et al. exemplifies this process. A substrate of electron emission material such as silicon is used. A thermally grown oxide layer is grown on the substrate and is then lithographically featured and etched to result in one or more islands of silicon dioxide. The substrate is then reoxidized during which the islands of previously formed oxide act to significantly retard the oxidation of the silicon under them. The resulting oxidation profile is very similar to the isotropic etch profile and similarly converges under the islands leaving a sharp point profile in the silicon which can be exposed by removing the oxide. Other masking material such as silicon nitride can be used to similarly retard the oxidation and produce the desired sharp tip profile.

A fifth category etches a pit which is the inverse of the desired sharply pointed shape in an expendable material which is used as a mold for the emitter material and then removed by etching. U.S. Pat. No. 4,307,507 issued to Gray et al exemplifies a limited embodiment of this technique. Holes in a masking material are lithographically formed on a single crystal silicon substrate. The substrate is orientation-dependent etched through the mask holes forming etch pits with the inverse of the desired pointed shape. The mask is removed and a layer of emission material is deposited over the surface filling the pits. The silicon of the mold is then etched away freeing the pointed replicas of the pits whose sharp points can be used as field emitters.

All of the emitter formation techniques mentioned above have several limitations. Orientation-dependent etching requires the use of a substrate of single crystal emitter material. Most all of them require the substrate to be made of or coated with the emitter material. Most all of them form the emitter first which complicates the fabrication of the subsequent electrode layers and the vacuum space needed for a fully functional Vacuum Microelectronic Device.

Sometimes the method used or the particular processing regime does not produce field emission tips of sufficiently small radius. The art includes some methods by which the tip can-be sharpened to further reduce this radius. In a paper by Campisi et al, "Microfabrication Of Field Emission Devices For Vacuum Integrated Circuits Using Orientation Dependent Etching", Mat. Res. Soc. Symp. Proc., Vol. 76, pages 67–72 (1987), reports the sharpening of silicon tips by slowly etching them in an isotropic etch. Another paper entitled "A Progress Report On The Livermore Miniature Vacuum Tube Project", by W. J. Orvis et al, IEDM 89, pages 529–531 (1989), reports the sharpening of silicon tips by thermally oxidizing them and then etching away the oxide. U.S. Pat. No. 3,921,022, also discloses a novel method of providing multiple tips or tiplets at the tip of a conical or pyramidical shaped field emitter.

Various processes creating two or three electrode VMD structures been reported in the art. As an example a paper entitled "A Progress Report On The Livermore Miniature Vacuum Tube Project", by Orvis et al, IEDM, pages 529–531 (1989), describes a process in which silicon emitters formed by either orientation-dependent or isotropic etching are used. Lithographically featured doped polysilicon anode and grid layers are separated from the emitter and each other by layers of low density glass.

It is now possible as exemplified in Busta, H. H. et al. "Field Emission from Tungsten-Clad Silicon Pyramids", IEEE Transactions on Electron Devices, Vol. 36, No. 11, pages 2679–2685 (November 1989), to use coating or cladding on these cathode tips or pyramids to enhance or modify the cathode tip properties.

In this developing field of Vacuum Microelectronic Devices the art has also started to show how these field emission cathodes and extraction electrodes can be used in a practical application, such as, in a display applications. U.S. Pat. No. 4,857,799 issued to Spindt et al illustrates how a substrate containing field emitters and extraction electrodes can be joined to a separate transparent window which contains anode conductors and phosphor strips, all of which can work in concert to form a color display. Another color display device using vacuum microelectronic type structure was patented in U.S. Pat. No. 3,855,499.

This patent application also discloses an etch process which can significantly reduce the unwanted undercut for a Vacuum Microelectronic Device while still allowing the formation of bridge structures.

In summary a typical field emission Vacuum Microelectronic Devices are made up of a sharply pointed cathode, surrounded by a control and/or extraction electrode, and pointing toward an anode surface. The cathode tip could have a point or a blade profile. One of the key technologies in fabricating these devices is the formation of the sharp field emission (cathode) tip which has preferably a radius on the order of 10–100 nm. The most common methods of formation include orientation-dependent etching, isotropic etching, and thermal oxidation.

SUMMARY AND OBJECTS OF THE INVENTION

In one aspect this invention discloses a process of making at least one integrated vacuum microelectronic device comprising the steps of:

a) providing at least one hole in a substrate having at least one electrically conductive material, b) filling at least a portion of the hole with at least one material sufficiently to form a cusp, c) depositing at least One layer of a material which is capable of emitting electrons under the influence of an electrical field, and filling at least a portion of the cusp to form a tip, d) providing at least one access hole to help facilitate the removal of material underneath the cusp, and e) removing the material underneath the cusp to expose at least a portion of the tip of the electron-emitting material and at least a portion of the electrically conductive material in the substrate, thereby forming at least one integrated vacuum microelectronic device.

In another aspect this invention discloses a process of making at least one integrated vacuum microelectronic device comprising the steps of:

a) providing at least one hole in a substrate, b) depositing at least one insulative material and filling the hole to form a cusp, c) depositing at least one layer of a material which is capable of emitting electrons under the influence of an electrical field, and filling at least a portion of the cusp to form a tip, d) providing at least one access hole to help facilitate the removal of material underneath the cusp, and e) through the access hole removing all of the material in the hole and exposing at least a portion of the tip of the electron-emitting material and at least a portion of the electrically conductive material in the substrate, thereby forming at least one integrated vacuum microelectronic device.

Still another aspect of this invention discloses an integrated vacuum microelectronic device comprising an electron-emitting material having a field emission tip and at least one access hole that leads into a chamber, wherein the field emitter tip face an anode which is in the chamber and separated by at least one material.

The integrated vacuum microelectronic device of this invention could also have at least one emitter tip which is electrically isolated from another tip or at least one tip could be electrically connected to another electronic component. Similarly, the anode could be a part of an electronic display device or the device itself could be a used in an electronic display device.

A product can also be made by any of the processes of this invention.

One object of this disclosure is to fabricate one or more Vacuum Microelectronic Devices, consisting of a field emitter tip (cathode) aligned inside a control electrode or grid or extraction electrode (gate) and diametrically opposed to a electron collection electrode (anode).

Another object is to modify the basic process to create simpler diode structures which function without gate structures.

Still another object is to add additional gate structures to form more complex devices such as, for example, tetrodes (two gates), pentodes (three gates), to name a few.

Yet another object is to limit the nonproductive undercut of this process by employing a novel two step etching sequence.

Still yet another object of this invention is to interconnect at least one of the VMD device into integrated circuits.

Yet another object of this invention is to interconnect at least one of the VMD device to another electronic device.

The objects of the present invention can be achieved using a novel fabrication process in which the conformal deposition of an insulator into a hole produces a symmetric cusp that can be used as a mold to form a pointed or sharp field emission tip. Since it is only the physical hole that allows the cusp to form, the hole can be created out of any stable material including layered alternating stacks of conductors and insulators which can act as the electrodes of the finished device. Two electrodes (anode and emitter) form a simple diode while three, four, and five electrodes would form respectively a triode, tetrode, and pentode for example. Further, since the cusp is self aligned within the center of the hole it is also aligned to the center of these electrodes. The basic device structure is completed by filling the cusp with a material capable of emitting electrons under the influence of an electric field or an electron-emitting material. Access holes created in the electron-emitting material allow the removal of the insulator of the cusp forming layer from the hole and from underneath the emitter material, thus forming a space and freeing the sharp tip of the emitter (field emission cathode) that was molded by the cusp.

The process is not limited to any particular set of emitter, conductor, or insulator materials. Many different materials and material combinations can easily be used with this process.

The removal of the cusp insulator material to produce a clean emitter tip, results in the removal of material from under the emitter to free the tip, requiring the use of for example an isotropic etch. Exclusive use of isotropic etching would produce excessive nonproductive undercut. This nonproductive undercut only serves to weaken the structure and occupy unnecessary space. To eliminate this limitation a novel two step etch process is used to minimize this nonproductive undercut. In this process, two access holes, one on each side of the emitter bridge that spans the vacuum space are made. These access holes intentionally overlap the vacuum space hole. These access holes further allow the cusp insulator etchants to empty the vacuum space. A reactive ion etch (RIE) is used to selectively etch the insulator all the way to the bottom of the vacuum space hole without undercut. A selective isotropic etch (wet or plasma) is then used to remove the insulator partition from under the bridge, thus freeing the emitter tip and creating the opening for the vacuum space or forming a chamber. The resulting undercut on other exposed insulator edges is limited to an amount equal to half the partition thickness because it is being etched from both sides.

Since the electrodes are made of simple conductors, device interconnection can be accomplished using the same layers and vertically through vias in the insulators. This eliminates the extra wiring layers and greatly simplifies overall fabrication, turnaround time, and device area by reducing the average number of device contact openings.

Passive devices are also easily made. For example, capacitors can be made across the normal insulating layers even allowing vertical coupling of layers capacitively (e.g. one device's plate to another's grid level) and can also be integrated in substrate using trench techniques. The use of metal oxides is a good example of resistor elements and it, too, may be done between vertical conductor levels or as separate elements.

Additional advantages and, features will become apparent as the subject invention becomes better understood by reference to the following detailed description when considered in conjunction with the accompanying drawings.

BRIEF DESCRIPTION OF THE DRAWINGS

The features of the invention believed to be novel and the elements characteristic of the invention are set forth with particularity in the appended claims. The drawings are for illustration only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
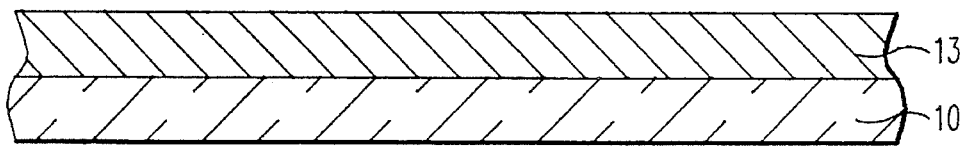
FIG. 1A, is a cross-sectional view of a base of a VMD having an conductive layer over an insulative substrate.

This invention describes a novel new technique and structure for the integrated fabrication of one or more integrated Vacuum Microelectronic Devices.

One of the major elements in the fabrication of the integrated Vacuum Microelectronic Device is the use of the cusp which is formed by the conformal deposition in a round hole. Other symmetrical hole shapes will also result in a single pointed cusp, but a round shaped hole will result in an optimum cusp.

The layer made of conductive material could also be made of composite layers of conductive material, so that the tip ends up as being made of a layered or composite material.

Once this template is etched away using isotropic etch which simultaneously forms the vacuum space, an emitter point will result. Preferably, this tip should have the required small radius (for example between 10–100 nm), required by the device, but if necessary, the tip can be further sharpened by isotropic etching or oxidizing a small amount of the conductor tip to achieve any desired tip radius.

It is important to note that many different combinations of materials, deposition techniques (sputter, CVD, plating, etc.), and etch techniques (wet, dry, ion, etc.) or additive pattern formation techniques can be used in the fabrication steps.

Another method of vertical integration is the stacking of whole device layer sets one on top of another. Since these devices are not dependent on special materials such as single crystal silicon, these device layer sets can also be integrated on top of other technologies such as semiconductors and multilayer ceramic packages.

The detailed description of the Vacuum Microelectronic Device structure and the process for fabricating it, as described below, has been simplified by using several predefined and named process sequences or definitions that are repetitively referenced.

The term VMD or Vacuum Microelectronic Device as used herein, means not only a diode but a triode, tetrode, pentode or any other device that is made using this process, including the interconnection thereof. Basically, a VMD is any device with at least a sharp emitter (cathode) tip, and a collector (anode) with an insulator separating the emitter and there is a preferably a direct transmission of electrons from the emitter to the collector.

The term "lithographically defined" refers to a process sequence of the following process steps. First a masking layer that is sensitive in a positive or negative sense to some form of actinic radiation, for example, light, E-beams, and/or X-rays, is deposited on the surface of interest. Second, this layer is exposed patternwise to the appropriate actinic radiation and developed to selectively remove the masking layer and expose the underlying surface in the patterns required. Third the exposed surface is etched to remove all or part of the underlying material as required. Fourth, the remaining areas of the masking layer are removed.

Alternatively, the term "lithographically defined" can refer to following "liftoff process." The same required patterns in a material layer as produced in the previously described process are created. This process starts on the surface that is to receive the desired patterned material layer. First, a masking layer that is sensitive in a positive or negative sense to some actinic radiation, for example, light, E-beams, and/or X-rays, is deposited on the surface. Secondly, this layer is exposed patternwise to the appropriate actinic radiation and developed to selectively remove the masking layer and expose the underlying surface in patterns where the desired material layer is to remain. The deposition, exposure, and development process is controlled in such a way that the edges of the remaining mask image has a negative or undercut profile. Thirdly, the desired material is deposited over both the open and mask covered areas by a line of sight deposition process such as evaporation. Finally, the mask material is removed, for example, by dissolution and freeing any material over it and allowing it to be washed away.

The term "conductive material" or "conductor layer" or "conductive substrate" refers to any of a wide variety of materials which are electrical conductors. Typical examples include the elements Mo, W, Ta, Re, Pt, Au, Ag, Al, Cu, Nb, Ni, Cr, Ti, Zr, and Hf, alloys or solid solutions containing two or more of these elements, doped and undoped semiconductors such as Si, Ge, or those commonly known as III–V compounds, and non-semiconducting compounds such as various nitrides, borides, cubides (for example $LaB_6$), and some oxides (of for example Sn, Ag, InSn).

The term "insulative material" or "insulator layer" or "insulative substrate" refers to a wide variety of materials that are electrical insulators especially glasses, and ceramics. Typical examples include elements such as carbon in a diamond form (crystalline or amorphous), single crystal compounds such as sapphire, glasses and polycrystalline or amorphous compounds such as some oxides of Si, Al, Mg, and Ce, some fluorides of Ca, and Mg, some carbides and nitrides of silicon, and ceramics such as alumina or glass ceramic.

The term "electron-emitting material" or "emitter layer" or "emitter material" refers to any material capable of emitting electrons under the influence of an electric field. Typical examples include any of the electrical conductors, such as the examples listed above, and borides of the rare earth elements, solid solutions consisting of 1) a boride of a rare earth or an alkaline earth (such as Ca, Sr, or Ba), and 2) a boride of a transition metal (such as Hf or Zr). The emitter material can be a single layered, a composite or a multilayered structure. An example of a multilayered emitter might include, the addition of one or more of the following, a work function enhancement layer, an robust emitter layer, a sputter resistant layer, a high performance electrically conductive layer, a thermally conductive layer, a physically strengthening layer or a stiffening layer. This multilayered composite may contain both emitter and non-emitter materials, which can all act synergistically together to optimize emitter performance. An example of this is discussed in Busta, H. H. et al. "Field Emission from Tungsten-Clad Silicon Pyramids", IEEE Transactions on Electron Devices, Vol. 36, No. 11, pages 2679–2685 (November 1989), where they show the use of coating or cladding on these cathode tips or pyramids to enhance or modify the cathode tip properties.

This coating or cladding can also be used in situations where one cannot form the desired tip structure or it is difficult to form the desired tip structure for the cathode emitter.

The term "deposited" refers to any method of layer formation that is suitable to the material as are generally practiced throughout the semiconductor industry. One or more of the following examples of deposition techniques can be used with the previously mentioned materials, such as, sputtering, chemical vapor deposition, electro or electroless plating, oxidation, evaporation, sublimation, plasma deposition, anodization, anodic deposition, molecular beam deposition or photodeposition.

The term "tip" as used herein means not only a pointed projection but also a blade. Field emitter shapes other than points are sometimes used, such as blades. Blades are formed using the same methods except that the hole is a narrow elongated segment. The shape of the sharp edge of the blade can be linear or circular or a linear segment or a curved segment to name a few.

The hole that is used to eventually form the cusp, from the cusp forming material, can be formed by a process selected from a group comprising, ablation, drilling, etching, ion milling or molding. The hole can also be etched, using etching techniques selected from a group comprising anisotropic etching, ion beam etching, isotropic etching, reactive ion etching, plasma etching or wet etching. The hole could have a profile where the dimensions of the hole are constant with depth or the dimensions of the hole could vary with depth.

The cusp forming material is preferably conformally deposited. The cusp forming material could be an insulative material or it could comprise of multilayers.

The access hole that is formed to remove the material from underneath the electron-emitter tip could be formed by a process selected from a group comprising, ablation, drilling, etching or ion milling. The access hole could also be etched, using etching techniques selected from a group comprising anisotropic etching, ion beam etching, isotropic etching, reactive ion etching, plasma etching or wet etching. Similarly, the material under the cusp could be removed by a process selected from the group comprising, dissolution or etching.

The substrate may be an insulator and serve as part of the isolation between adjacent electrical structures. Insulating substrates are especially useful in minimizing parasitic capacitance which can in turn significantly improve device frequency response. Transparent insulating substrates are especially useful in display applications where the substrate can also serve as the display window on which both light emitting structures and control circuits can be integrated together.

The substrate could be made of a conductive material. A conductive substrate may serve as part of the functioning structure such as a common anode (plate) or a common bias voltage conductor. A conductive substrate can also be isolated from the electrical devices with the simple addition of an insulating layer.

The substrate whether made from a conductive material or an insulative material serves primarily as a physical support for subsequent functional layers and processing.

Figure 1B:
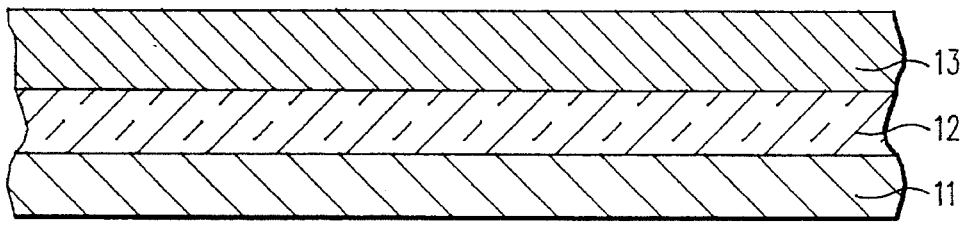
FIG. 1B, is a cross-sectional view of another embodiment of a base of a VMD having an conductive layer, and an in insulator layer over a conductive substrate.

FIGS. 1A and 1B, illustrate the device base structure. If the Vacuum Microelectronic Device, is to be formed on an insulative substrate 10, then a film or layer of conductive anode 13, is deposited directly on the insulative substrate 10, as illustrated in FIG. 1A. The insulative substrate 10, could be made of a silicon dioxide material, but other materials as discussed earlier can be used. Doped polysilicon is a typical material for the anode 13, but other electrically conductive material as discussed elsewhere could be used.

When a conductive substrate is used as a common anode, or is a doped semiconductor material with any desired isolations formed by electrically biased P-N junctions, that substrate can be used directly. If, a non-semiconductor conductive substrate (or a doped semiconductor substrate without P-N junctions), is to be isolated from the electrical devices, then an insulating layer is deposited, followed by the deposition of an anode conductive layer.

If an electrically isolatable VMD device is to be formed on conductive substrate 11, as shown in FIG. 1B, then on the conductive substrate 11, an insulative film or layer 12 is deposited. A layer or film of a conductive anode 13, which could be doped polysilicon, is then deposited on the insulator layer 12. The material for the conductive substrate 11, could be a silicon material. The insulative layer 12, can be formed by the oxidizing the silicon material of the substrate 11, or be deposited by other means known in the art. Other materials that are equally acceptable for the conductive substrate 11 or the insulative layer 12, have already been discussed earlier.

Once it is decided on the basic substrate structure then the subsequent steps can be the same. For the illustration of the best mode to carry out this invention the substrate configuration of FIG. 1A, will be used, even though similar device would result if the substrate configuration of FIG. 1B, is used.

Figure 2:
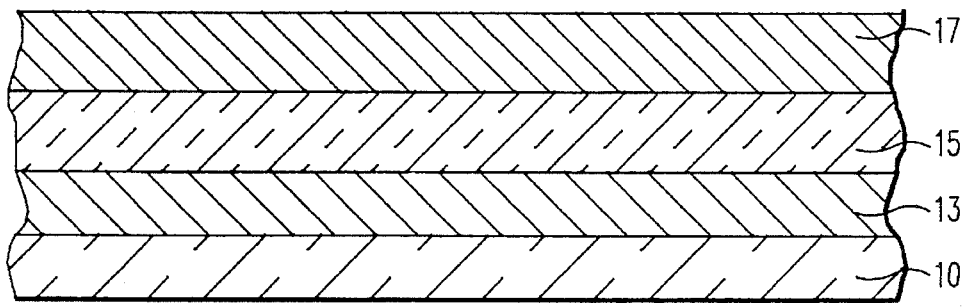
FIG. 2, show a cross-sectional view of the base of FIG. 1A having a grid insulator and a grid conductor over it.

As shown in FIG. 2, on the anode conductive layer 13, a layer of grid insulator 15, could be made for example, by oxidizing the doped polysilicon of layer 13, or by depositing an insulating glass layer, to name a few. On top of grid insulator 15, is deposited a layer of grid conductor 17, by any of the methods discussed earlier. The material for the grid conductor 17, for example, could be doped polysilicon but, other materials discussed elsewhere can also be used.

This process of forming additional insulative or conductive materials is repeated for each control electrode structure desired in the final active device.

Figure 3:
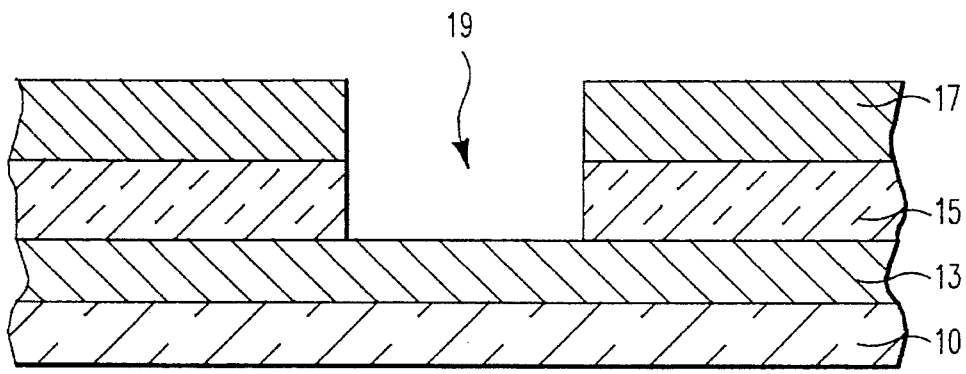
FIG. 3, is a cross-sectional view with a portion of the VMD structure etched.

The next step is to create the vacuum hole or space 19, as shown in FIG. 3. The vacuum space 19, is lithographically defined and etched by methods well known in the art. The shape of the etch vacuum space 19, can be square, round, oval, etc. The radius or half of the maximum cross-sectional width of the etched vacuum space 19, should be smaller than the thickness of the sum of the layers that are deposited or formed above the anode grid conductor 17. Anisotropic reactive ion etching RIE (Reactive Ion Etching) is the preferred etch method, but other methods known in the art could also be used. The vertical or near vertical hole walls have minimal lateral etching. This keeps electrode holes small and uniform and also minimizes the overall area occupied by the device. This operation creates holes through all of the control electrode conductor and insulator layers and will ultimately provide the vacuum spaces for each of the Vacuum Microelectronic Devices. Etching is continued through the grid conductive layer 17, and the grid insulator layer 15, until at least a portion of the anode layer 13, is exposed. The vacuum space 19, does not need to extend all the way to the upper surface of the conductive material or anode 13, if any of the left-over material of the grid material or insulator 15, will etch out in the subsequent vacuum space etching. It should be noted that the base layer or substrate that is used be of sufficient thickness to allow for the proper formation of hole or vacuum space 19.

Figure 4:
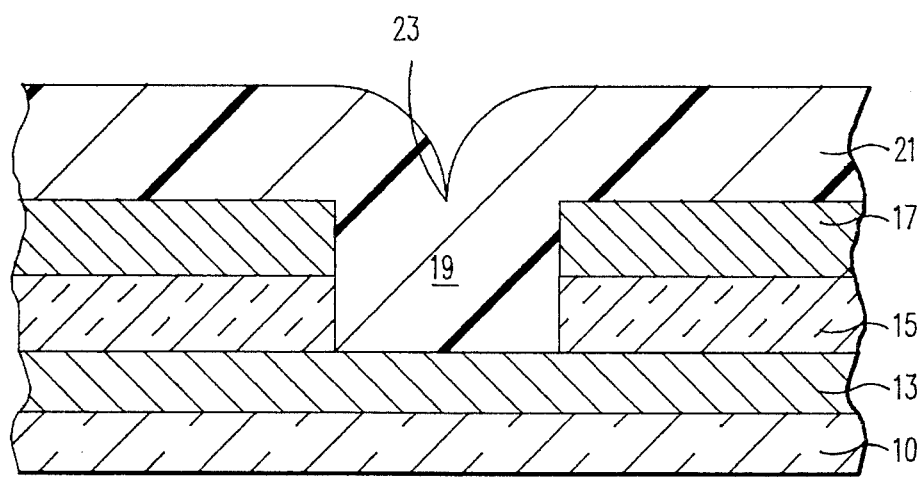
FIG. 4, is a cross-sectional view showing the deposition of a cusp forming material.

As shown in FIG. 4, an insulative layer 21, of sufficient thickness is conformally deposited to close the etch vacuum space 19, in FIG. 3, and form a cusp 23. The insulative layer 21, for the purpose of illustration is a silicon dioxide material. The insulative layer 21, can be formed, for example, by conformal chemical vapor deposition (CVD) process. Conformal CVD deposition is typically used but other processes such as anodization, and even marginally conformal processes such as sputtering can produce acceptable results. Deposition is continued until the sidewall coatings converge and close the vacuum space hole 19. This convergence forms the symmetrical cusp 23, with a very fine convergence point at the bottom which is self-aligned to the center of the vacuum space hole 19.

Figure 5:
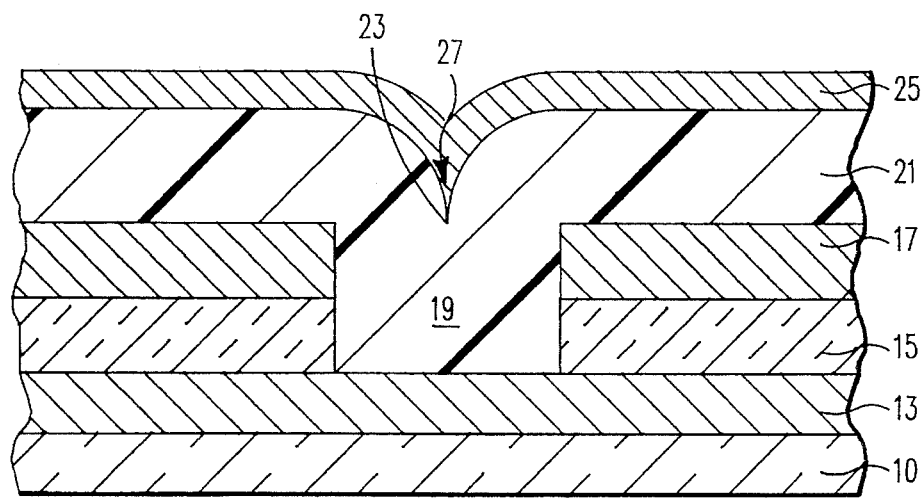
FIG. 5, is a cross-sectional view showing the deposition of an electron-emitting material.

An electron-emitting material or layer 25, is deposited by any means that will allow the material to fill the cusp 23. This deposition could be done as shown in FIG. 5, for example, by CVD, evaporation, sublimation, sputtering, electroless deposition, or plating. The electron-emitting layer 25, acts as a cathode during the operation of the device, and the sharp tip 27, acts as the cathode emitter. The electron-emitting material 25, could be formed for example by using doped polysilicon or tungsten, but other materials as discussed elsewhere could also be used.

Figure 6:
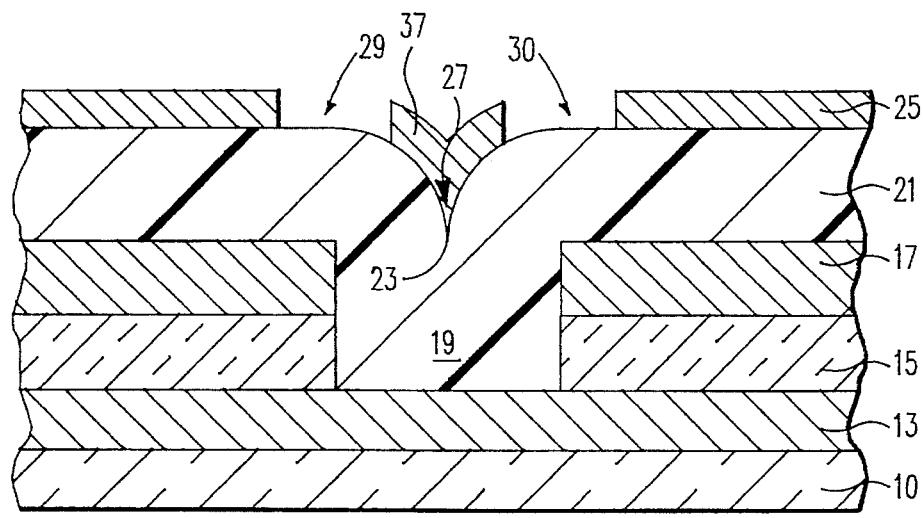
FIG. 6, is a cross-sectional view showing the access holes through the electron-emitting material.

The emitter layer 25, is now lithographically featured with one or more access holes 29 and 30, exposing the insulator layer 21, as shown in FIG. 6. Two or more holes per device are desirable to improve etching access, and to control undercut as will be explained below. The access hole(s) are positioned to overlap the vacuum space hole 19, partially but not to overlap the cusp 23.

The insulator layer 21, is now selectively etched completely out of the vacuum space 19, leaving conductive layers 25, 17 and 13, intact. This leaves a bridge 37, of emitter layer 25, spanning the newly created vacuum space or hole or chamber 39, and supporting the sharp emitter tip 27, above the exposed anode 13. The selective etch can etch grid insulator 15, without harm to the finished device. The selective etch can be a single step isotropic (wet or plasma) etch which will result in a finished device 45, as shown in FIG. 7A.

Figure 7A:
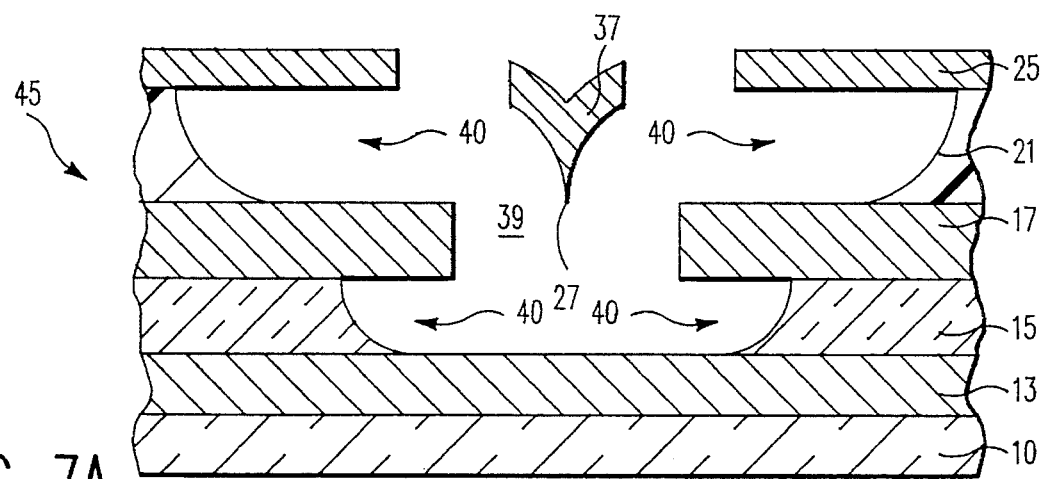
FIG. 7A, is a cross-sectional view of a completed VMD triode as a result of an isotropic etching.

Device 45 in FIG. 7A is a functionally acceptable triode device with emitter tip 27, self-aligned in grid electrode 17, and directly opposed to anode 13. It does, however, exhibit excessive nonfunctional undercut 40, which not only weakens the device structure, but also enlarges the device and adversely affects the circuit density.

Figure 7B:
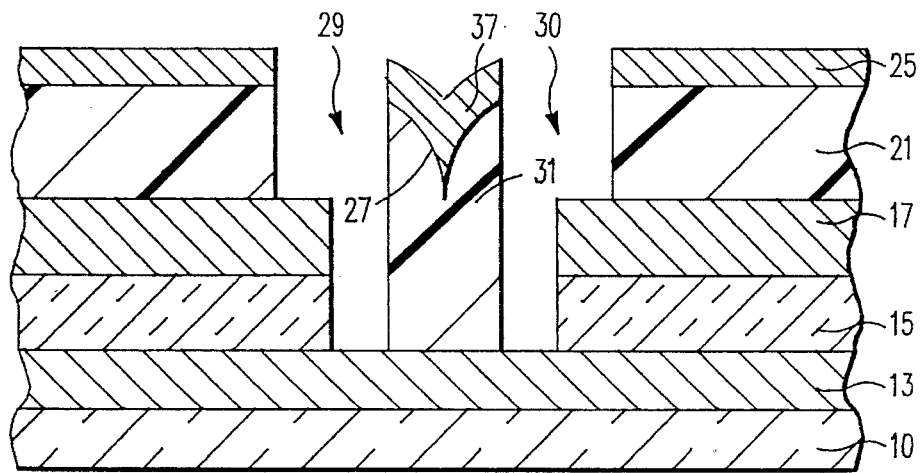
FIG. 7B, is a cross-sectional view of a VMD triode as a result of an anisotropic etching.
Figure 8:
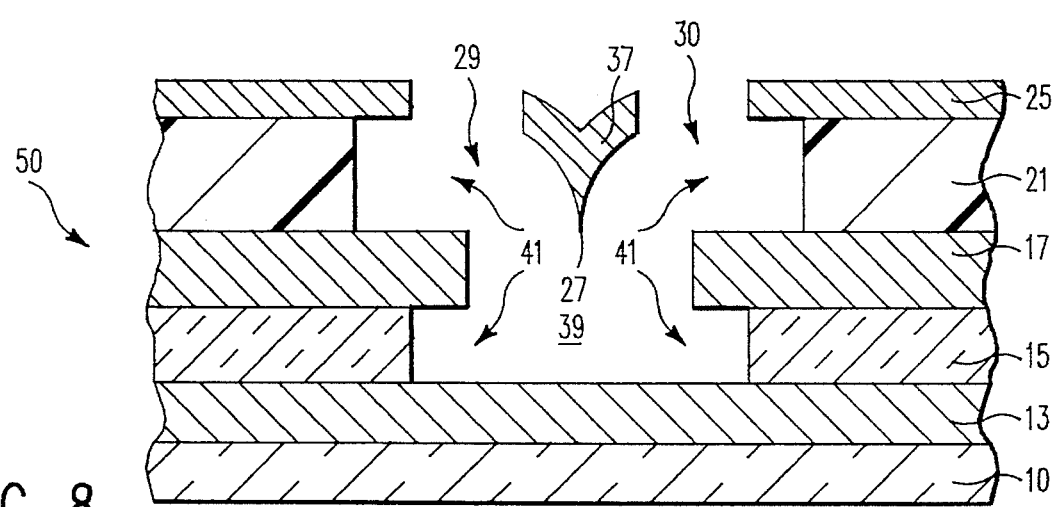
FIG. 8, is a cross-sectional view of a completed VMD triode as a result of an isotropic etching of the structure of FIG. 7B.

A two-step etch process minimizes these unnecessary attributes. A selective anisotropic etch is first used to etch, without undercut, layer 21, all the way to the bottom of the vacuum hole 19, as shown in FIG. 7B. This is possible because the access holes 29 and 30, overlap the vacuum space or hole 19. This leaves only a thin partition or a web 31, under the emitter bridge 37, when two access holes 29 and 30, one on each side of the bridge 37, are used. A selective isotropic etch (wet or plasma) is then used to remove the insulator partition 31, from under the bridge 37, freeing the sharp emitter tip 27, and completing the opening of vacuum space or chamber 39, as shown in FIG. 8. The resulting undercut 41, on other exposed insulator edges, is limited to an amount equal to half the thickness of partition 31, because it is being etched from both sides. The resulting finished device 50, is shown in FIG. 8.

It must be remembered that the access holes 29 and 30, as shown in FIG. 7B, are in two dimensions, and that the etching to create access holes 29 and 30, was carried out using isolated holes, and therefore both the partitions 31 and bridge 37, are still a part of the insulating layer 21 and the conductive layer 25, respectively.

The removal of the material under the bridge 37, is usually the last operation done in order to minimize contamination of that space or to avoid the problem of removing future processing materials from that confined area.

The sharp emitter tip 27, molded by the cusp 23, can generally be controlled to have the desired small radius tip without requiring further processing. If, however, a smaller tip radius is desired or if a particular set of desirable materials, process techniques, and/or process conditions produce a larger then desired tip radius, then the tip can be sharpened. This sharpening (the reduction of the tip radius) can be done, for example, by slow etching of the tip with an isotropic etch or the oxidation of the tip followed by the removal of the oxide layer.

The process above, which results in triode Vacuum Microelectronic Device 45 or 50, can easily be adapted to form other configurations. In the figures for the following examples the two step etch process as used to remove layer 21, from hole 19, to create vacuum space 39, as was used to produce triode device 50, will be illustrated.

FIGS. 9A, 9B, 9C, and 9D, illustrate a few embodiments of a diode made according to the teachings of this invention. An example of a diode process sequence is created starting with the basic triode process sequence through grid insulator 15. The grid conductor layer 17, is eliminated. The remaining process steps that would normally produce triode 50, will now produce VMD diode 60, illustrated in FIG. 9A. The phantom boundary of vacuum space hole 19, would be solid if the selective etch for the conformal layer 21, does not attack layer 15, or would be lost as shown if it is attacked by the selective etch process.

Figure 9A:
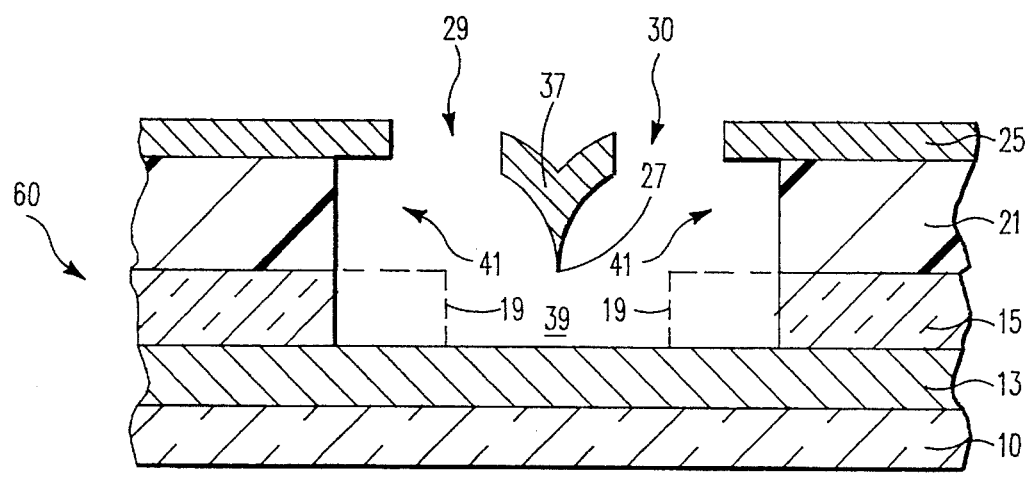
FIG. 9A, is a cross-sectional view of VMD diode made according to the teachings of this invention.
Figure 9B:
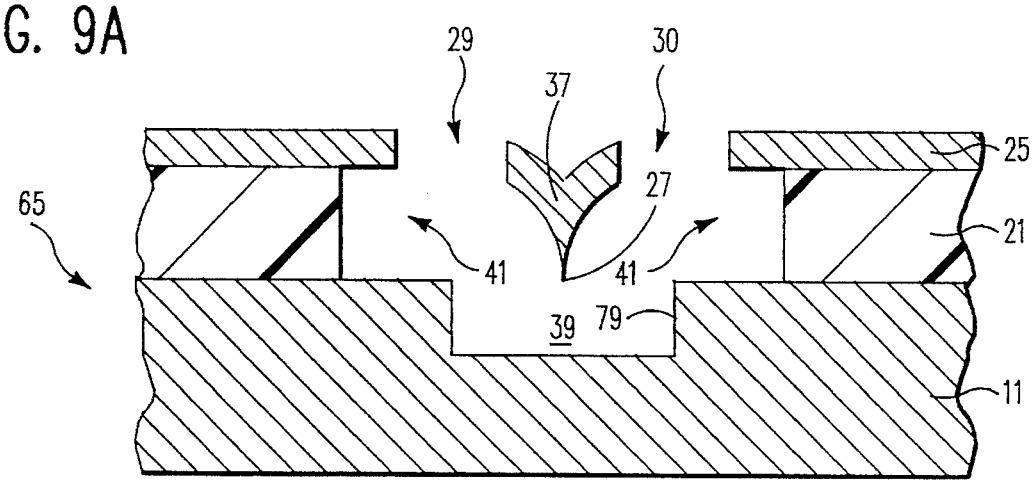
FIG. 9B, is a cross-sectional view of another embodiment of a VMD diode made according to the teachings of this invention.

FIG. 9B, shows the simplest form of a diode structure that can be made by etching a vacuum hole 79, which is similar to the hole 19, directly into an electrically conductive substrate 11. The layer 11, must be sufficiently thick to allow for the formation of the hole 79. Starting with the deposition of the conformal layer 21, the processing continues as discussed earlier. A VMD diode 65, will result once the process is completed as illustrated in FIG. 9B.

Figure 9C:
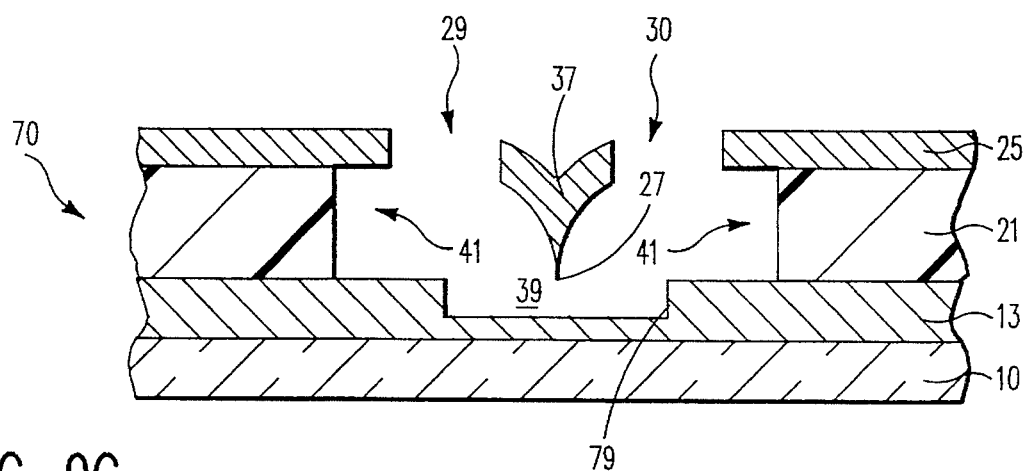
FIG. 9C, is a cross-sectional view of still another embodiment of a VMD diode made according to the teachings of this invention.

Similarly, a diode structure that can be produced on an insulative substrate 10, which has been covered with the anode layer 13, is disclosed in FIG. 9C. The layer 13, must be sufficiently thick to allow for the formation of the hole 79, which is similar to the hole 19. The processing continues as discussed earlier and upon completion, the result is a VMD diode 70, as shown in FIG. 9C.

Figure 9D:
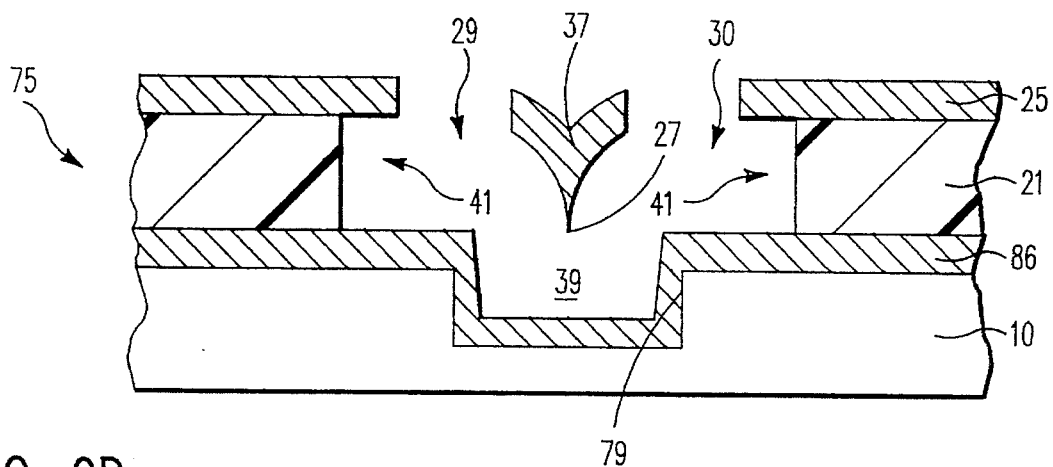
FIG. 9D, is a cross-sectional view of yet still another embodiment of a VMD diode made according to the teachings of this invention.

Another embodiment of this invention is illustrated in FIG. 9D, where the insulative substrate 10, is first featured with hole 79, and then anode conductive material or layer 86, is conformally deposited. The basic process starting with the conformal deposition of insulator layer 21, as discussed earlier is followed and the end result is a VMD diode 75, as illustrated in FIG. 9D.

Figure 10:
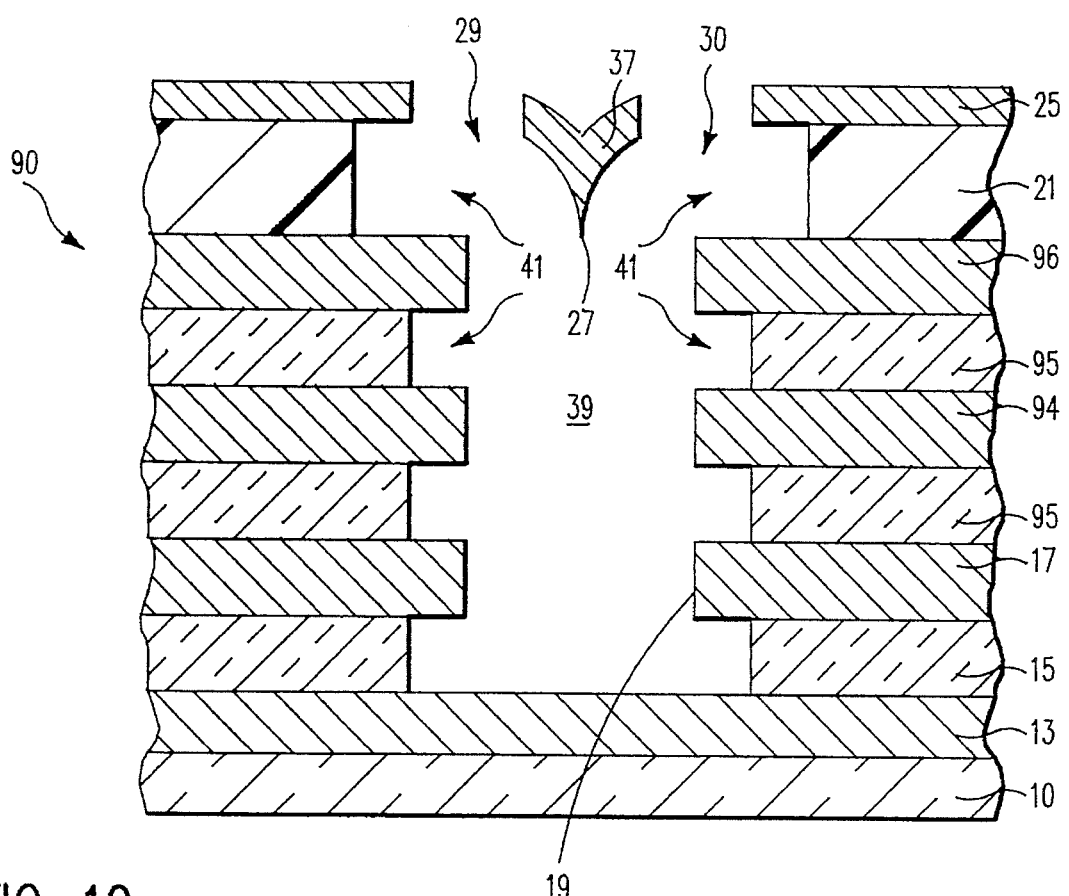
FIG. 10, is a cross-sectional view of a completed pentode VMD made according to the teachings of this invention.

Many variations of more complex Vacuum Microelectronic Devices can also be created by extending the basic triode process. One example of this variation is a VMD pentode device 90, as shown in FIG. 10. The device 90, can be created from the basic triode process sequence by following the basic triode device sequence through the deposition of grid conductor layer 17, then adding, steps depositing grid insulator 93, on grid conductor 17, depositing grid conductor layer 94, on layer 93, depositing grid insulator layer 95, on layer 94, and depositing grid conductor layer 96, on layer 95. The basic triode process is resumed at this step by creating hole 19. In this case the hole 19, is etched through all the layers until the upper surface of the conductive material or layer 13, is exposed. If the basic triode process sequence that would normally lead to device 50, is followed from this point, it will result in pentode device 90.

The insulator and conductor layers used above to create the Vacuum Microelectronic Devices described can also be used to isolate and interconnect multiple electronic devices or components in three dimensions, integrating circuits of these devices at the same time that the devices are being fabricated. This is not illustrated but can be accomplished by lithographically patterning each conductive and insulative layer after it is deposited and before proceeding to the next step. Conductor material is removed where isolations are desired and featured into islands and paths to form interconnections between different devices, between devices and vias, and between different vias. Insulator layers can be featured with a pattern of via openings to the conductive layer below. Actual via connections may be made either by the formation of a stud (a conductive plug formed by a number of conventional methods) or filled by the direct blanket deposition of the next conductive layer thus creating vertical interconnection pathways through the structure.

Any interconnection patterns created on the emitter level can be made at the same time that the access holes 29 and 30, are being made, but since the insulator under them will be etched when the vacuum space is etched the undercutting of these interconnections represents a limitation on the size of these features. The two step etch will significantly minimize this undercut just as it does in the device itself, but a further enhancement of this process can eliminate undercut everywhere except the vacuum device area. To accomplish this, a separate or a second lithographic step is used to feature any emitter level isolations interconnections and access holes. The second lithographic patterning protects all of the interconnection and isolation features and exposes only the access holes. The vacuum space etching which follows uses the two step etch previously described and the small amount of undercut that occurs is limited to the vacuum space area only.

Many combinations of insulators and conductors may be used in the fabrication procedures and device structures described. Specific applications may dictate special material properties such as resistivity, dielectric constant, thermal stability, physical strength, etc. but in general there are three basic requirements for compatibility. First, the materials must be compatible with the processing required for fabrication which may limit some material combinations in particular fabrication regimes. Second, their must be adequate adhesion between adjacent layers. Third, the materials must be stable and not contaminate the operating environment of the vacuum devices which is typically a moderate to high vacuum. This last requirement is somewhat open because some of these devices may be able to operate in up to 1 atmosphere or more of a high ionization potential gas such as He. This may be possible because their microscopic dimensions provide very small path lengths and allow the use of low extraction voltages.

Figure 11:
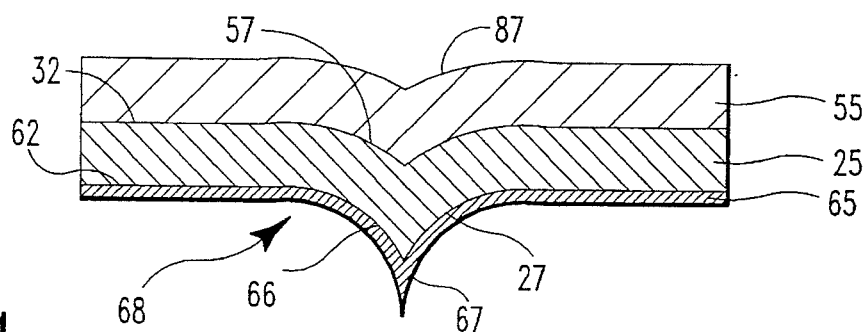
FIG. 11, shows a cross-sectional view of an emitter layer composed of a plurality of layers.

FIG. 11, illustrates the structural details of a composite or multilayered emitter 68. To incorporate this structure into a device, a layer 65, is formed over the insulative layer 21, and into the primary cusp 23, of FIG. 4. An intermediate cusp 66, on the surface 62, is usually formed during this process. The layer 65, must be of a material which is capable of emitting electrons under the influence of an electrical field. Layer 25, can now be formed over the layer 65, and into the intermediate cusp 66. Since the surface of the tip 67, now becomes the field emission surface it is clear that the layer 25, need not be made of a field emission material, but can be made of any material compatible with the process and the operating environment of the device as long as it adheres to the surface 62, of layer 65. Furthermore, one or more additional layers, as exemplified by layer 55, may be formed over layer 25, on surface 32, and into the secondary cusp 57. The layer 55, may have tertiary cusp 87. Layer 55, has the same compatibility requirements as discussed and described for layer 25, and it must also adhere to the surface 32, of the layer 25. After the formation of the composite or multilayered emitter 68, the device structure processing continues starting with the operations illustrated in FIG. 6.

Means of isolating and interconnecting multiple field emitters, extraction electrodes, and other electrodes in useful electrical configurations can also be provided. This can be done because, the electrode layers including the emitter layer are typically good conductors and as such, they can be lithographically patterned before the next layer is added to form isolations and interconnections between emitter structures. Similarly, the associated insulators can be lithographically featured to provide via openings for vertical interconnections. One use of such patterning is in the creation of a display device. For example, FIG. 8, could have an insulative substrate 10, that is made from a transparent material, such as glass or quartz, and the anode layer 13, could be a conductive phosphor, such as ZnO(Zn) or comprised of a transparent electrically conductive layer and a phosphor layer, resulting in a light emitting device. Electrons emitted from the tip 27, under the influence of the electric field produced by more positive voltages on the grid and phosphor would impinge on the phosphor layer producing light which could be viewed through the transparent substrate 10. Furthermore, if in an array of such light emitting devices, the grid or the extraction layer and the emitter layer are formed into X and Y addressing lines, individual or groups of such light emitting devices can be selectively activated which would form a matrix addressable display device. Another use of such patterning is the formation of groups of individual vacuum microelectronic devices and passive electronic elements, such as resistors and capacitors, that are electrically interconnected during fabrication to form integrated circuits. Yet another use of such patterning is the formation of groups of active devices, passive devices and light emitting devices that are interconnected into electronic circuits that electronically drive, control, and select the individually selectable, individual or group of light emitting devices.

Figure 12:
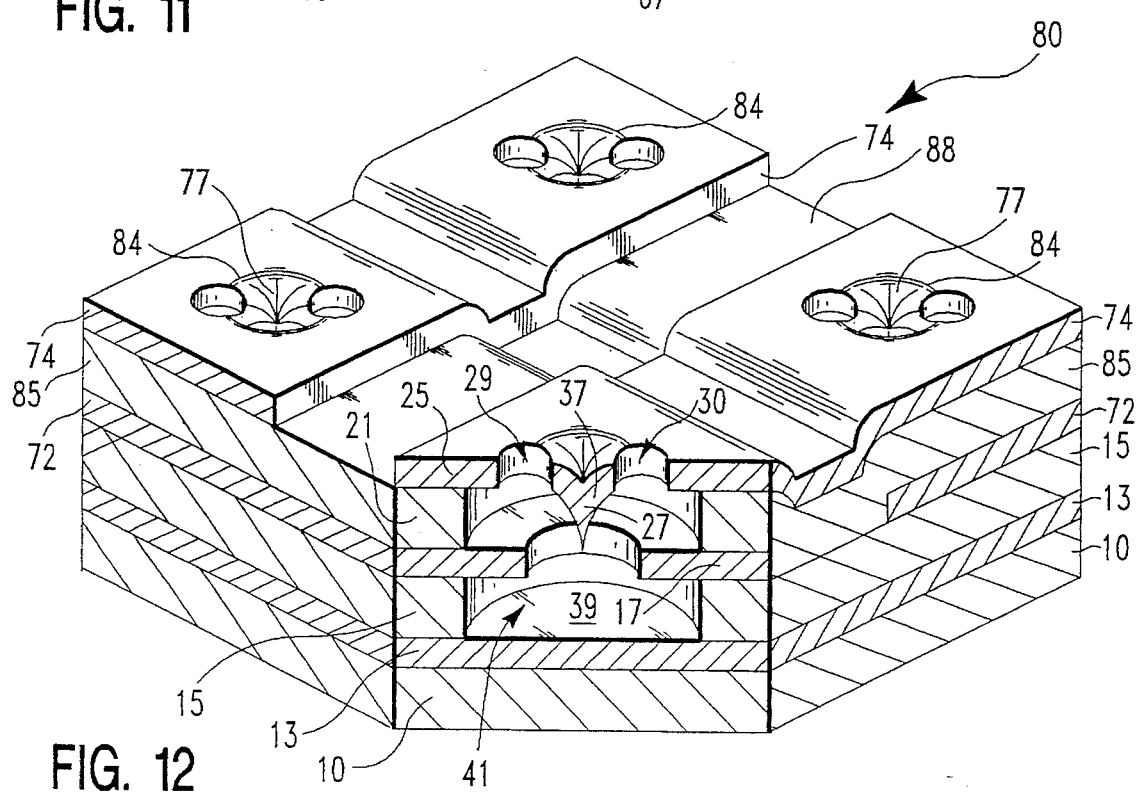
FIG. 12, illustrates a perspective and cut-away view of a partial field emission structure that has been interconnected.

FIG. 12, is a perspective cross-sectional view of a partial structure that will be used to illustrate an example of simple interconnections of four triodes made according to the process of this invention, and the process details have been discussed earlier in reference to FIG. 8. In the field emitter interconnect 80, the emitter layer has been lithographically featured into lines which interconnect individual emitters 84, in the "X" direction and form "X" emitter lines 74. The space 88, isolates one "X" emitter line 74, from another "X" emitter line 74. Similarly, the grid or extraction electrode layer is lithographically featured into "Y" electrode line 72, with insulative material 85, filling the spaces and isolating one "Y" electrode line 72, from another "Y" electrode line 72. Instead of open space 88, one could also have insulating material there. Insulating or cusp forming layer 85, separates the individual extraction electrode 17, or "Y" electrode line 72, from the individual emitter electrode 84 or the "X" emitter line 74. Also, shown is the secondary cusp 77, that will result from the formation of the emitter tip 27, next to the access holes 29 or 30, adjacent to the secondary cusp 77. Of course, it would be obvious to one skilled in the art to have more than one electrode in this structure between the emitter electrode 84, and the anode 13. This interconnection arrangement allows a particular emitter to be activated by putting a negative potential on a particular emitter 84, in the "X" emitter line 74, and a positive potential on a particular grid or extraction electrode 17, or "Y" electrode line 72.

Figure 13:
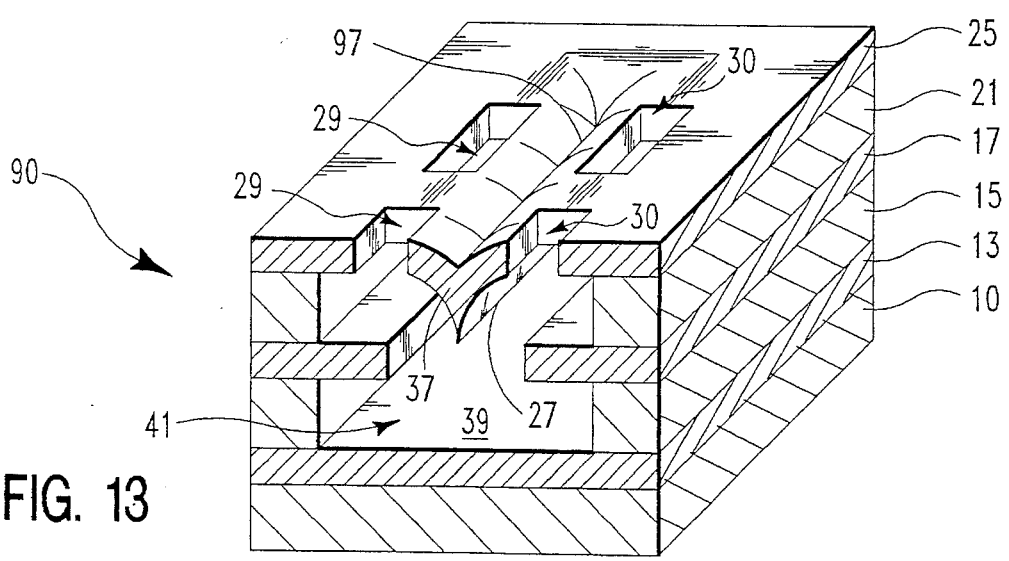
FIG. 13, illustrates a perspective and cut-away view of a partial field emission structure showing the tip with a blade profile.

FIG. 13, is similar to the structure as shown in FIG. 8, except it is a perspective and a cut-away view of a finished device 90, showing the tip 27, having of a blade type profile and an elongated secondary cusp 97. The method of making the tip 27, having a blade profile is exactly the same as discussed earlier in reference to FIG. 8. FIG. 13, also shows that a plurality of access holes 29, and 30, can be used to help facilitate the removal of material underneath the cusp 23.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An integrated vacuum microelectronic device comprising an electron-emitting material having at least one field emission tip and at least one access hole that leads into a chamber, wherein said field emitter tip faces an anode which is in said chamber and is separated by at least one insulating material, and wherein at least a portion of said at least one access hole in said electron-emitting material faces said anode.

2. The integrated vacuum microelectronic device of claim 1, further comprises at least two devices and wherein at least a portion of one of said device is electrically connected to said second device.

3. The integrated vacuum microelectronic device of claim 1, wherein said insulating material further comprises one or more additional insulating materials separated by at least one electrically conductive material.

4. The integrated vacuum microelectronic device of claim 1, wherein said electron-emitting layer is multilayered.

5. The integrated vacuum microelectronic device of claim 1, wherein at least one tip is multilayered.

6. The integrated vacuum microelectronic device of claim 1, further comprising on the tip side of the electron-emitting layer at least one barrier layer, which is selectively removed to expose said tip.

7. The integrated vacuum microelectronic device of claim 1, wherein said tip has a coating of a second electron-emitting material.

8. The integrated vacuum microelectronic device of claim 1, wherein said tip is sharpened.

9. The integrated vacuum microelectronic device of claim 1, further comprises at least two devices, wherein at least a portion of one device is electrically isolated from a portion of said second device.

10. The integrated vacuum microelectronic device of claim 1, wherein at least a portion of said device is electrically connected to a portion of at least one passive device.

11. An integrated vacuum microelectronic device comprising an electron-emitting material having at least one field emission tip and at least one access hole that leads into a chamber, wherein said field emitter tip faces an anode which is in said chamber and is separated by at least one insulating material, and wherein said tip has a secondary cusp.

12. The integrated vacuum microelectronic device of claim 1, wherein said tip has a point or a blade profile.

13. The integrated vacuum microelectronic device of claim 1, wherein said field emission tip preferably has a radius of between 10 to 100 nm.

14. The integrated vacuum microelectronic device of claim 2, wherein at least one of said devices has a field emission tip that has a pointed projection.

15. The integrated vacuum microelectronic device of claim 2, wherein at least one of said devices has a field emission tip that has a blade profile.

16. The integrated vacuum microelectronic device of claim 1, wherein said field emission tip faces a substrate and wherein said anode is on the substrate side of said integrated vacuum microelectronic device.

17. The integrated vacuum microelectronic device of claim 1, wherein said substrate is the anode.

18. The integrated vacuum microelectronic device of claim 1, wherein said electron-emitting material is selected from a group comprising Mo, W, Ta, Re, Pt, Au, Ag, Al, Cu, Nb, Ni, Cr, Ti, Zr, Hf and alloys thereof or solid solutions containing two or more of these elements.

19. The integrated vacuum microelectronic device of claim 1, wherein the material for said anode is selected from a group comprising Mo, W, Ta, Re, Pt, Au, Ag, Al, Cu, Nb, Ni, Cr, Ti, Zr, Hf and alloys thereof or solid solutions containing two or more of these elements.

20. The integrated vacuum microelectronic device of claim 1, wherein said electron-emitting material is selected from a group comprising doped and undoped semiconductors.

21. The integrated vacuum microelectronic device of claim 1, wherein said insulating material is selected from a group comprising sapphire, glass or oxides of Si, Al, Mg and Ce.

22. The integrated vacuum microelectronic device of claim 2, wherein at least one tip of one of said device is multilayered.

23. The integrated vacuum microelectronic device of claim 1, wherein said device is stacked on top of other technology and electrically connected thereto.

24. The integrated vacuum microelectronic device of claim 1, further comprises at least two devices, and wherein one of said device is stacked on top of said second device.

25. The integrated vacuum microelectronic device of claim 1, wherein at least a portion of said chamber has a profile where the dimensions of the chamber are constant with depth.

26. The integrated vacuum microelectronic device of claim 1, wherein at least a portion of said chamber has a profile where the dimensions of the chamber vary with depth.

27. The integrated vacuum microelectronic device of claim 1, wherein said anode is of a semiconductor material.

28. The integrated vacuum microelectronic device of claim 1, wherein said anode is of a semiconductor material, and wherein said semiconductor material has electrically biased P-N junctions to create an electrically isolated region in said anode.

29. The integrated vacuum microelectronic device of claim 1, wherein said anode is on an insulative substrate.

* * * * *